(12) United States Patent
Dede et al.

(10) Patent No.: US 8,659,896 B2
(45) Date of Patent: Feb. 25, 2014

(54) COOLING APPARATUSES AND POWER ELECTRONICS MODULES

(75) Inventors: Ercan Mehmet Dede, Ann Arbor, MI (US); Yan Liu, Canton, MI (US)

(73) Assignee: Toyota Motor Engineering & Manufacturing North America, Inc., Erlanger, NY (US)

( * ) Notice: Subject to any disclaimer, the term of this patent is extended or adjusted under 35 U.S.C. 154(b) by 326 days.

(21) Appl. No.: 12/880,422

(22) Filed: Sep. 13, 2010

(65) Prior Publication Data

US 2012/0063091 A1    Mar. 15, 2012

(51) Int. Cl.
*H05K 7/20* (2006.01)
*H05K 7/00* (2006.01)
*F28F 7/00* (2006.01)
*F28D 15/00* (2006.01)

(52) U.S. Cl.
USPC ........... 361/699; 361/710; 361/722; 361/702; 165/104.33; 165/80.4; 165/908; 363/141

(58) Field of Classification Search
USPC ............. 361/699, 710, 722, 702; 165/104.33, 165/80.4, 908; 363/141
See application file for complete search history.

(56) References Cited

U.S. PATENT DOCUMENTS

| | | | |
|---|---|---|---|
| 4,201,195 A * | 5/1980 | Sakhuja | ........................ 126/675 |
| 4,322,737 A | 3/1982 | Sliwa, Jr. | |
| 4,392,153 A | 7/1983 | Glascock, II et al. | |
| 4,494,171 A | 1/1985 | Bland et al. | |
| 4,733,293 A | 3/1988 | Gabuzda | |
| 4,748,495 A | 5/1988 | Kucharek | |
| 4,783,721 A | 11/1988 | Yamamoto et al. | |
| 4,868,712 A | 9/1989 | Woodman | |
| 4,920,574 A | 4/1990 | Yamamoto et al. | |
| 5,016,138 A | 5/1991 | Woodman | |
| 5,023,695 A | 6/1991 | Umezawa et al. | |
| 5,079,619 A | 1/1992 | Davidson | |
| 5,088,005 A | 2/1992 | Ciaccio | |
| 5,119,175 A | 6/1992 | Long et al. | |
| 5,145,001 A | 9/1992 | Valenzuela | |
| 5,210,440 A | 5/1993 | Long | |
| 5,228,502 A | 7/1993 | Chu et al. | |
| 5,260,850 A | 11/1993 | Sherwood et al. | |
| 5,269,372 A | 12/1993 | Chu et al. | |
| 5,270,572 A | 12/1993 | Nakajima et al. | |

(Continued)

OTHER PUBLICATIONS

U.S. Appl. No. 12/839,039, filed Jul. 19, 2010, titled: Heat Exchanger Fluid Distribution Manifolds and Power Electronics Modules Incorporating the Same.

*Primary Examiner* — Bradley Thomas
(74) *Attorney, Agent, or Firm* — Dinsmore & Shohl, LLP

(57) ABSTRACT

A cooling apparatus for a power electronics system includes a jet plate, a target plate, a plurality of fluid collection passageways, and a fluid outlet. The jet plate includes an array of impingement jets having a jet body and an impingement jet channel. The target plate includes an array of microchannel cells having a plurality of radially-extending wavy-fin microchannels. The coolant fluid is directed toward an impingement location through the array of impingement jets and travels through the wavy-fin microchannels. The plurality of fluid collection passageways are arranged in a grid pattern such that the coolant fluid exits the wavy-fin microchannels and flows into the plurality of fluid passageways. The coolant fluid exits the cooling apparatus through the fluid outlet. The cooling apparatus may be incorporated into a power electronics module having a power electronics device to cool the power electronics device.

20 Claims, 5 Drawing Sheets

(56) References Cited

U.S. PATENT DOCUMENTS

| | | | |
|---|---|---|---|
| 5,310,440 A * | 5/1994 | Zingher | 156/345.11 |
| 5,316,075 A * | 5/1994 | Quon et al. | 165/80.4 |
| 5,365,400 A * | 11/1994 | Ashiwake et al. | 361/752 |
| 5,394,299 A | 2/1995 | Chu et al. | |
| 5,546,274 A | 8/1996 | Davidson | |
| 5,548,907 A * | 8/1996 | Gourdine | 34/448 |
| 5,912,800 A | 6/1999 | Sammakia et al. | |
| 5,959,351 A * | 9/1999 | Sasaki et al. | 257/714 |
| 5,978,220 A * | 11/1999 | Frey et al. | 361/699 |
| 5,983,997 A | 11/1999 | Hou | |
| 6,058,010 A | 5/2000 | Schmidt et al. | |
| 6,167,948 B1 | 1/2001 | Thomas | |
| 6,167,952 B1 * | 1/2001 | Downing | 165/167 |
| 6,242,075 B1 | 6/2001 | Chao et al. | |
| 6,305,463 B1 | 10/2001 | Salmonson | |
| 6,333,853 B2 | 12/2001 | O'Leary et al. | |
| 6,431,260 B1 | 8/2002 | Agonafer et al. | |
| 6,501,654 B2 | 12/2002 | O'Connor et al. | |
| 6,580,609 B2 | 6/2003 | Pautsch | |
| 6,609,560 B2 * | 8/2003 | Cho et al. | 165/104.26 |
| 6,665,185 B1 | 12/2003 | Kulik et al. | |
| 6,828,675 B2 | 12/2004 | Memory et al. | |
| 6,903,931 B2 | 6/2005 | McCordic et al. | |
| 6,942,018 B2 | 9/2005 | Goodson et al. | |
| 6,952,346 B2 | 10/2005 | Tilton et al. | |
| 6,972,365 B2 | 12/2005 | Garner | |
| 6,988,535 B2 | 1/2006 | Upadhya et al. | |
| 6,992,382 B2 | 1/2006 | Chrysler et al. | |
| 6,994,151 B2 | 2/2006 | Zhou et al. | |
| 7,017,654 B2 | 3/2006 | Kenny et al. | |
| 7,035,104 B2 * | 4/2006 | Meyer | 361/700 |
| 7,058,101 B2 | 6/2006 | Treusch et al. | |
| 7,071,408 B2 | 7/2006 | Garner | |
| 7,104,312 B2 | 9/2006 | Goodson et al. | |
| 7,119,284 B2 | 10/2006 | Bel et al. | |
| 7,184,269 B2 | 2/2007 | Campbell et al. | |
| 7,188,662 B2 | 3/2007 | Brewer et al. | |
| 7,204,303 B2 | 4/2007 | Thomas et al. | |
| 7,205,653 B2 | 4/2007 | Brandenburg et al. | |
| 7,212,409 B1 | 5/2007 | Belady et al. | |
| 7,250,674 B2 | 7/2007 | Inoue | |
| 7,295,440 B2 | 11/2007 | Ganev et al. | |
| 7,298,617 B2 | 11/2007 | Campbell et al. | |
| 7,298,618 B2 | 11/2007 | Campbell et al. | |
| 7,302,998 B2 | 12/2007 | Valenzuela | |
| 7,327,570 B2 | 2/2008 | Belady | |
| 7,336,493 B2 | 2/2008 | Berkenbush et al. | |
| 7,355,277 B2 | 4/2008 | Myers et al. | |
| 7,365,981 B2 | 4/2008 | Myers et al. | |
| 7,385,817 B2 | 6/2008 | Campbell et al. | |
| 7,393,226 B2 | 7/2008 | Clayton et al. | |
| 7,397,662 B2 | 7/2008 | Oyamada | |
| 7,400,504 B2 | 7/2008 | Campbell et al. | |
| 7,414,844 B2 | 8/2008 | Wilson et al. | |
| 7,429,792 B2 | 9/2008 | Lee et al. | |
| 7,435,623 B2 | 10/2008 | Chrysler et al. | |
| 7,450,378 B2 | 11/2008 | Nelson et al. | |
| 7,486,514 B2 | 2/2009 | Campbell et al. | |
| 7,495,916 B2 | 2/2009 | Shiao et al. | |
| 7,516,776 B2 * | 4/2009 | Bezama et al. | 165/80.4 |
| 7,551,439 B2 | 6/2009 | Peugh et al. | |
| 7,599,184 B2 | 10/2009 | Upadhya et al. | |
| 7,608,924 B2 | 10/2009 | Myers et al. | |
| 7,679,911 B2 | 3/2010 | Rapp | |
| 7,738,249 B2 | 6/2010 | Chan et al. | |
| 7,795,726 B2 | 9/2010 | Myers et al. | |
| 7,808,780 B2 | 10/2010 | Brunschwiler et al. | |
| 7,830,664 B2 | 11/2010 | Campbell et al. | |
| 7,839,642 B2 | 11/2010 | Martin | |
| 8,037,927 B2 * | 10/2011 | Schuette | 165/104.26 |
| 2002/0053726 A1 | 5/2002 | Mikubo et al. | |
| 2002/0079088 A1 * | 6/2002 | Agonafer et al. | 165/80.4 |
| 2003/0150599 A1 * | 8/2003 | Suzuki | 165/104.21 |
| 2003/0196451 A1 | 10/2003 | Goldman et al. | |
| 2004/0206477 A1 * | 10/2004 | Kenny et al. | 165/80.4 |
| 2005/0121180 A1 | 6/2005 | Marsala | |
| 2005/0199372 A1 | 9/2005 | Frazer et al. | |
| 2005/0225938 A1 | 10/2005 | Montgomery et al. | |
| 2005/0230085 A1 * | 10/2005 | Valenzuela | 165/104.26 |
| 2006/0002086 A1 | 1/2006 | Teneketges et al. | |
| 2006/0002087 A1 * | 1/2006 | Bezama et al. | 361/699 |
| 2006/0144565 A1 * | 7/2006 | Tsai et al. | 165/104.26 |
| 2006/0266498 A1 * | 11/2006 | Liu et al. | 165/80.4 |
| 2006/0291164 A1 | 12/2006 | Myers et al. | |
| 2007/0034360 A1 | 2/2007 | Hall | |
| 2007/0041160 A1 | 2/2007 | Kehret et al. | |
| 2007/0074856 A1 | 4/2007 | Bhatti et al. | |
| 2007/0114656 A1 | 5/2007 | Brandenburg et al. | |
| 2007/0119565 A1 * | 5/2007 | Brunschwiler et al. | 165/80.2 |
| 2007/0177352 A1 | 8/2007 | Monfarad et al. | |
| 2007/0188991 A1 | 8/2007 | Wilson et al. | |
| 2007/0221364 A1 * | 9/2007 | Lai et al. | 165/80.4 |
| 2007/0230127 A1 | 10/2007 | Peugh et al. | |
| 2007/0236883 A1 | 10/2007 | Ruiz | |
| 2007/0272392 A1 * | 11/2007 | Ghosh et al. | 165/80.4 |
| 2007/0274045 A1 * | 11/2007 | Campbell et al. | 361/699 |
| 2007/0295480 A1 * | 12/2007 | Campbell et al. | 165/80.4 |
| 2008/0093053 A1 | 4/2008 | Song et al. | |
| 2008/0169087 A1 * | 7/2008 | Downing | 165/80.4 |
| 2008/0245506 A1 | 10/2008 | Campbell et al. | |
| 2008/0264604 A1 * | 10/2008 | Campbell et al. | 165/80.4 |
| 2009/0032937 A1 | 2/2009 | Mann et al. | |
| 2009/0090490 A1 | 4/2009 | Yoshida et al. | |
| 2009/0108439 A1 | 4/2009 | Brandenburg et al. | |
| 2009/0213546 A1 * | 8/2009 | Hassani et al. | 361/702 |
| 2009/0294106 A1 | 12/2009 | Flotta et al. | |
| 2010/0000766 A1 | 1/2010 | Loiselet et al. | |
| 2010/0038774 A1 | 2/2010 | Zhang et al. | |
| 2010/0142150 A1 | 6/2010 | Campbell et al. | |
| 2010/0242178 A1 | 9/2010 | Goetting | |
| 2010/0246117 A1 | 9/2010 | Brunschwiler et al. | |
| 2011/0141690 A1 * | 6/2011 | Le et al. | 361/689 |

* cited by examiner

COOLING APPARATUSES AND POWER ELECTRONICS MODULES

TECHNICAL FIELD

The present specification generally relates to apparatuses for cooling heat generating devices such as power electronic devices and, more specifically, to cooling apparatuses and power electronics modules utilizing radially extending microchannels and fluid collection passageways to route coolant fluid and cool a heat generating device.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer and remove such heat from the heat generating device. For example, a jet of cooling fluid may be directed such that it impinges a surface of the heat generating device. Another method for removing heat from a heat generating device is to couple the device to a finned heat sink made of a thermally conductive material, such as aluminum.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels.

Accordingly, a need exists for alternative jet impingement heat exchangers and methods to cool heat generating devices.

SUMMARY

In one embodiment, a cooling apparatus for a power electronics system includes a jet plate, a target plate, a plurality of fluid collection passageways, and a fluid outlet. The jet plate includes an array of impingement jets, wherein each impingement jet has a jet body and an impingement jet channel disposed within the jet body. The jet channel is operable to pass a coolant fluid. The target plate includes an array of microchannel cells. Each microchannel cell has a plurality of wavy-fin microchannels radially extending from an impingement location. The coolant fluid is directed toward the impingement location through the array of impingement jets and travels through the wavy-fin microchannels in a radial direction. The plurality of fluid collection passageways are arranged in a grid pattern such that the coolant fluid exits the wavy-fin microchannels and flows into the plurality of fluid collection passageways. The fluid outlet is fluidly coupled to the fluid collection passageways such that the coolant fluid exits the cooling apparatus through the fluid outlet.

In another embodiment, a power electronics module includes a cooling apparatus, a substrate layer, and at least one power electronics device. The cooling apparatus for a power electronics system includes a jet plate, a target plate, a plurality of fluid collection passageways, a housing, and a fluid outlet. The jet plate includes an array of impingement jets, wherein each impingement jet has a jet body and an impingement jet channel disposed within the jet body. The jet channel is operable to pass a coolant fluid. The target plate includes an array of microchannel cells. Each microchannel cell has a plurality of wavy-fin microchannels radially extending from an impingement location positioned opposite from an individual impingement jet channel. The coolant fluid is directed toward the impingement location through the array of impingement jets and travels through the wavy-fin microchannels in a radial direction. The plurality of fluid collection passageways are arranged in a grid pattern such that the coolant fluid exits the wavy-fin microchannels and flows into the plurality of fluid collection passageways. The fluid outlet is fluidly coupled to the fluid collection passageways such that the coolant fluid exits the cooling apparatus through the fluid outlet. The power electronics device is coupled to the substrate layer. The housing encloses the jet plate, target plate and plurality of fluid collection passageways.

In yet another embodiment, a cooling apparatus for a power electronics system includes a jet plate, a target plate, a plurality of fluid collection passageways, and a fluid outlet. The jet plate includes an array of impingement jets. Each impingement jet includes a jet body and an impingement jet channel disposed within the jet body. The target plate includes an array of microchannel cells. Each microchannel cell may include a plurality of features having one or more curved walls that define a plurality of wavy-fin microchannels that radially extend from an impingement location positioned opposite from an individual impingement jet channel. A geometrical configuration of each of the wavy-fin microchannels may be optimized for a reduced flow resistance and heat transfer between a coolant fluid and the target plate, and the coolant fluid may be directed toward the impingement location through the array of impingement jets and travel through the wavy-fin microchannels in a radial direction. The plurality of fluid collection passageways are positioned between the jet bodies of the array of impingement jets and arranged in a grid pattern. The coolant fluid exits the wavy-fin microchannels, flows into the plurality of fluid collection passageways, and is directed to a perimeter of the cooling apparatus through the plurality of fluid collection passageways. The fluid outlet is fluidly coupled to the fluid collection passageways such that the coolant fluid exits the cooling apparatus through the fluid outlet.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1A:
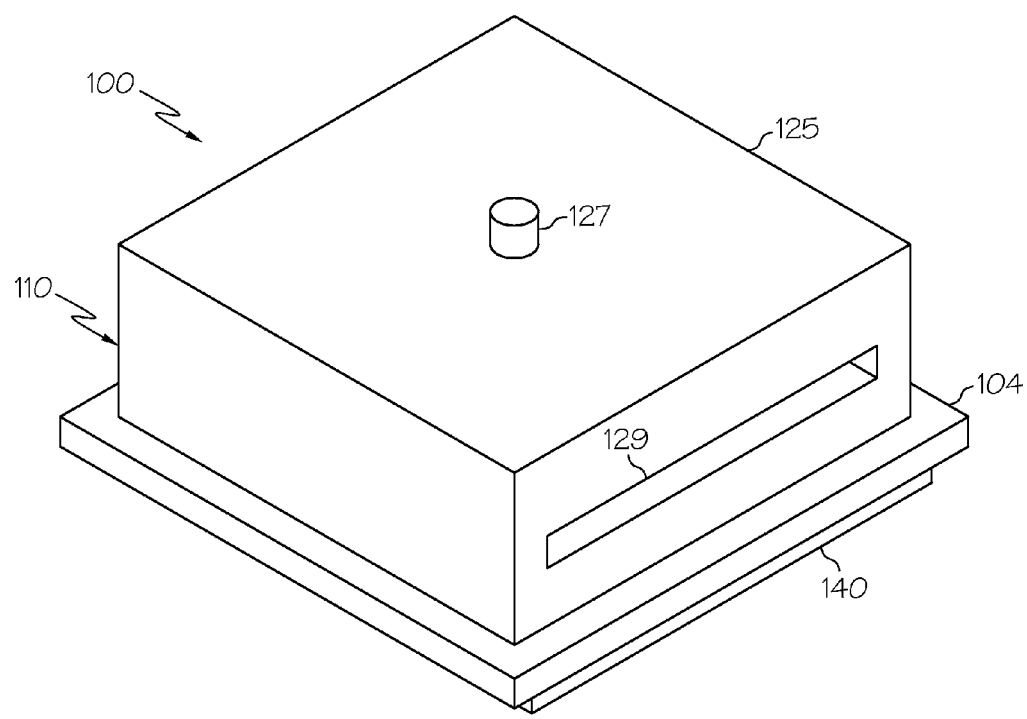
FIG. 1A depicts a perspective view of a power electronics module comprising a cooling apparatus according to one or more embodiments shown and described herein.
Figure 1B:
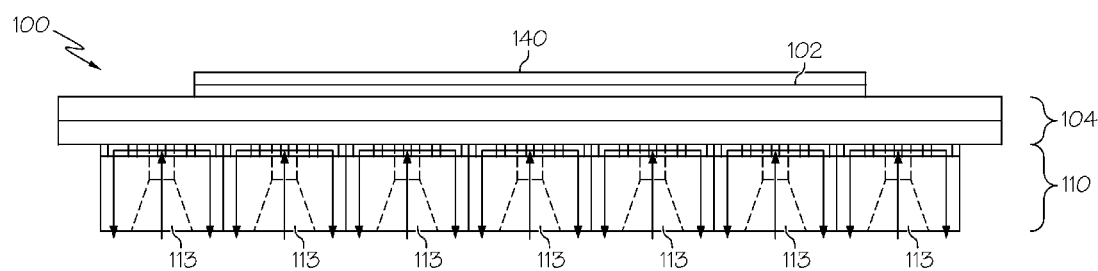
FIG. 1B depicts a side view of a power electronics module comprising a cooling apparatus according to one or more embodiments shown and described herein.
Figure 1C:
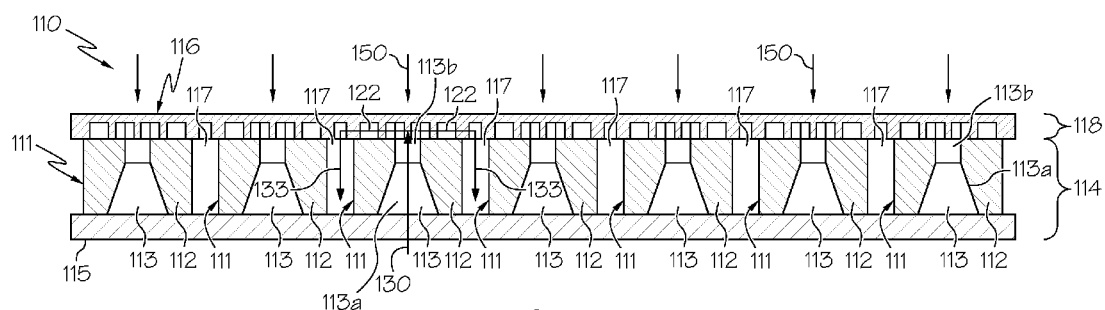
FIG. 1C depicts a cross section view of a cooling apparatus according to one or more embodiments shown and described herein.

FIGS. 1A-1C generally depict one embodiment of a power electronics module and associated cooling apparatus. The cooling apparatus generally comprises a jet plate, a target plate, a plurality of fluid collection passageways, and a fluid outlet. The target plate has an array of microchannel cells. Each microchannel cell comprises a plurality of wavy-fin microchannels that radially extend from an impingement location, which is located at the center of the microchannel cell. The jet plate comprises an array of impingement jets operable to produce a jet of a coolant fluid that impinges the microchannel cells at the impingement locations. The fluid collection passageways are positioned between the impingement jets and receive the coolant fluid after the coolant fluid flows through the wavy-fin microchannels of each microchannel cell. The coolant fluid that is collected in the fluid collection passageways may then exit the cooling apparatus via the fluid outlet. The radially-extending wavy-fin microchannels provide a substantially enhanced target surface area which may increase thermal transfer to the coolant fluid. The relatively short distance the coolant fluid travels within the wavy-fin microchannels and the immediate removal of the coolant fluid from the target plate surface through the fluid collection passageways may both increase heat transfer and reduce pressure drop. The cooling apparatus may be incorporated into a power electronics modules having a power electronics device. Various embodiments of cooling apparatuses, power electronics modules and operations thereof will be described in more detail herein.

Referring now to FIG. 1A, one embodiment of a power electronics module 100 is illustrated. The power electronics module 100 generally comprises a cooling apparatus 110, a substrate layer 104, and a heat generating device 140, such as a power electronics device. The cooling apparatus 110 generally comprises a housing 125, a fluid inlet 127, and a fluid outlet 129. Fluid may be introduced into the cooling apparatus 110 via the fluid inlet 127, circulate within the cooling apparatus as described in detail below, and exit the cooling apparatus 110 at the fluid outlet 129. It is noted that the fluid inlet 127 is illustrated as a single cylindrical nozzle but embodiments are not limited thereto. Any number of fluid inlets may be utilized, as well as any type of fluid inlet configuration and shape. The cooling apparatus 110 may also comprise a fluid manifold (not shown) that is either internal or external to the housing 125 to introduce fluid into the cooling apparatus 110. A fluid line (not shown) may be coupled to the fluid inlet 127 to provide coolant fluid from a coolant source (not shown), such as a radiator of a vehicle, for example. The coolant fluid may be any liquid capable of removing heat generated by the power electronics device 140, such as water, radiator fluid, etc.

The fluid outlet 129 is illustrated in FIG. 1A as a rectangular slot. However, embodiments are not limited to the illustrated configuration. For example, the fluid outlet may comprise a plurality of openings/outlets of any shape or size. In another embodiment, the fluid outlet may be configured as a single circular opening or nozzle operable to provide an exit flow path for the coolant fluid. In the illustrated embodiment, a rectangular coupling device may be connected to the fluid outlet and an exit fluid line that is further connected to the coolant fluid source such that warmed coolant fluid exiting the cooling apparatus 110 may be recirculated back to the coolant fluid source.

The power electronics device 140 (or multiple power electronics devices) may be coupled to the cooling apparatus 110 via a thermally conductive substrate layer 104. The power electronics device 140 may be one or more semiconductor devices that may include, without limitation, IGBTs, RC-IGBTs, MOSFETs, power MOSFETs, diodes, transistors, and/or combinations thereof (e.g., power cards). As an example, the power electronics device or devices 140 may be used in a vehicular electrical system, such as in hybrid-electric or electric vehicles (e.g., an inverter system). Such power electronics devices may generate significant heat flux when propelling a vehicle. It should be understood that the embodiments of the cooling apparatuses and power electronics modules described herein may also be utilized in other applications and are not limited to vehicular applications.

The substrate layer 104 may be a thermally conductive layer that aids in transferring the thermal energy generated by the power electronics device 140 to the cooling apparatus 110. The substrate layer 104 may comprise a direct bonded aluminum substrate, a direct bonded copper substrate, or other similar substrate layer. The power electronics device 140 may be coupled to the substrate layer 104 using any appropriate coupling method. In one embodiment, a bond layer 102 (FIG. 1B) is used to couple the power electronics device 140 to the substrate layer 104 and cooling apparatus 110. As examples and not limitations, the bond layer may comprise a solder layer, a nano-silver sinter layer, or a transient-liquid-phase layer.

Figure 2:
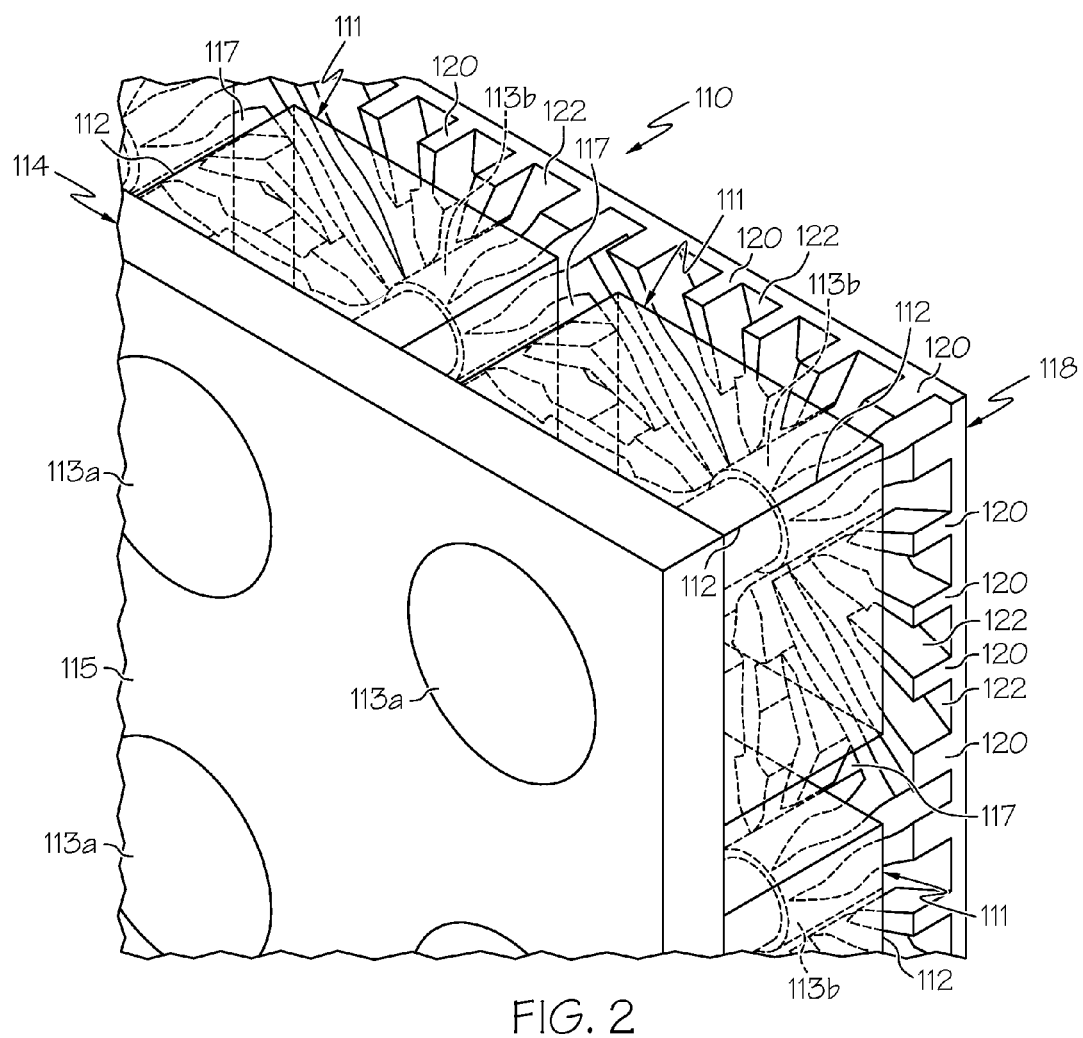
FIG. 2 depicts a partial perspective view of a cooling apparatus according to one or more embodiments shown and described herein.
Figure 3:
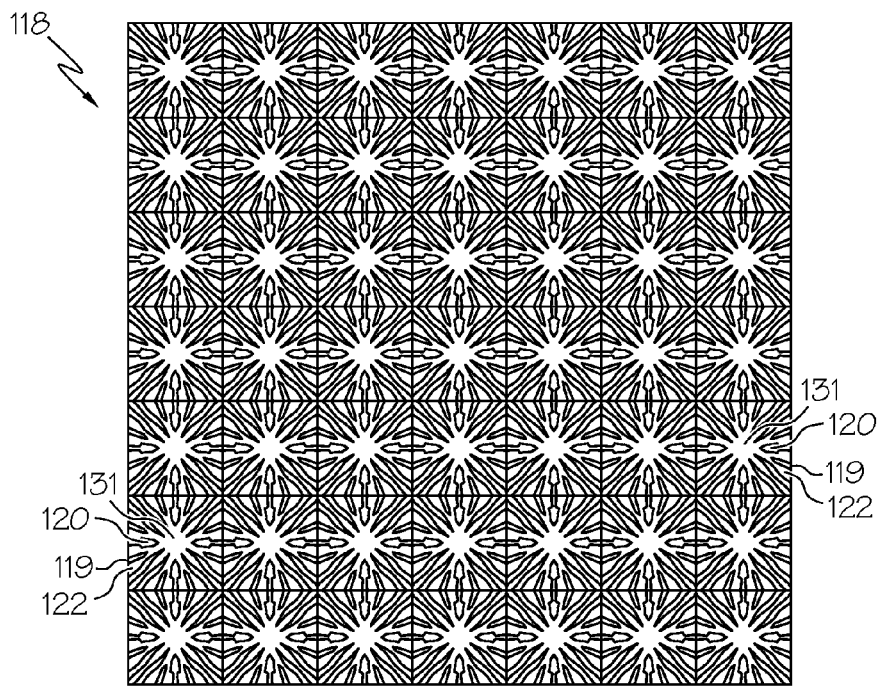
FIG. 3 depicts a top view of a target plate of a cooling apparatus according to one or more embodiments shown and described herein.

Referring to FIGS. 1B, 1C and 2, a side view of a power electronics module 100, a cross section view of a cooling apparatus 110, and a partial, exposed view of a cooling apparatus 110 are illustrated, respectively. The devices illustrated in FIGS. 1B, 1C and 2 are depicted without the housing 125 shown in FIG. 1A to illustrate the internal components of the cooling apparatus 110. The illustrated cooling apparatus 110 generally comprises a jet plate 114 and a target plate 118. A partial perspective view of the target plate 118 is shown in FIG. 2 and a top view of the target plate 118 is illustrated in FIG. 3. The target plate 118 comprises an array of microchannel cells 119 that each have a pattern of wavy-fin microchannels 122. The wavy-fin microchannels 122 radially-extend from a centrally-located impingement location 131. Although symmetric wavy-fin microchannel patterns are illustrated in FIGS. 1C and 3, embodiments are not limited thereto. For example, the wavy-fin microchannel patterns may be asymmetrical.

The wavy-fin microchannels 122 are defined by a plurality of wedge-shaped features 120 that radially extend from the impingement location 131. The wavy-fin microchannels 122 are located between the wedge-shaped features 120. The features 120 have different shapes and sizes. The features 120 have curved walls and are geometrically optimized to reduce pressure drop, enhance heat transfer, reduce flow resistance, and direct the coolant fluid outwardly from the impingement location 131. The term optimized as used herein means that the geometrical configuration of the features and resulting microchannels are designed to enhance fluid flow, reduce pressure drop, and increase heat transfer to the coolant fluid. In other words, the microchannels are not simply straight channels, and the features defining the microchannels have curved walls and differ in size and shape (i.e., non-uniform size and shape). By selecting the geometrical configuration of the target layer features 120, the coolant fluid may more efficiently flow within each microchannel cell 119. Curved walls also increase the surface area in which the coolant fluid is in contact with the target plate 118, thereby increasing thermal transfer from the target plate 118 to the coolant fluid. The geometric configuration of the wedge-shaped features 120 and resulting wavy-fin microchannels 122 located therebetween may be determined by computer simulation, for example. The geometric configuration utilized for the wavy-fin microchannels 122 may depend on parameters such as flow resistance, the type of coolant fluid, and the desired maximum operating temperature of the power electronics device, for example. The flow of coolant fluid within the plurality of wavy-fin microchannels, as well as operation of the coolant apparatus 110, is described in more detail below.

The target plate 118 may be made of a thermally conductive material that allows for the transfer of thermal energy from the target plate 118 to the coolant fluid. Exemplary materials include, but are not limited to, copper, aluminum, thermally enhanced composite materials, and polymer composite materials. The target plate 118 and corresponding components may be formed by a molding process, machining process or similar processes to achieve the desired shape and configuration.

Figure 4A:
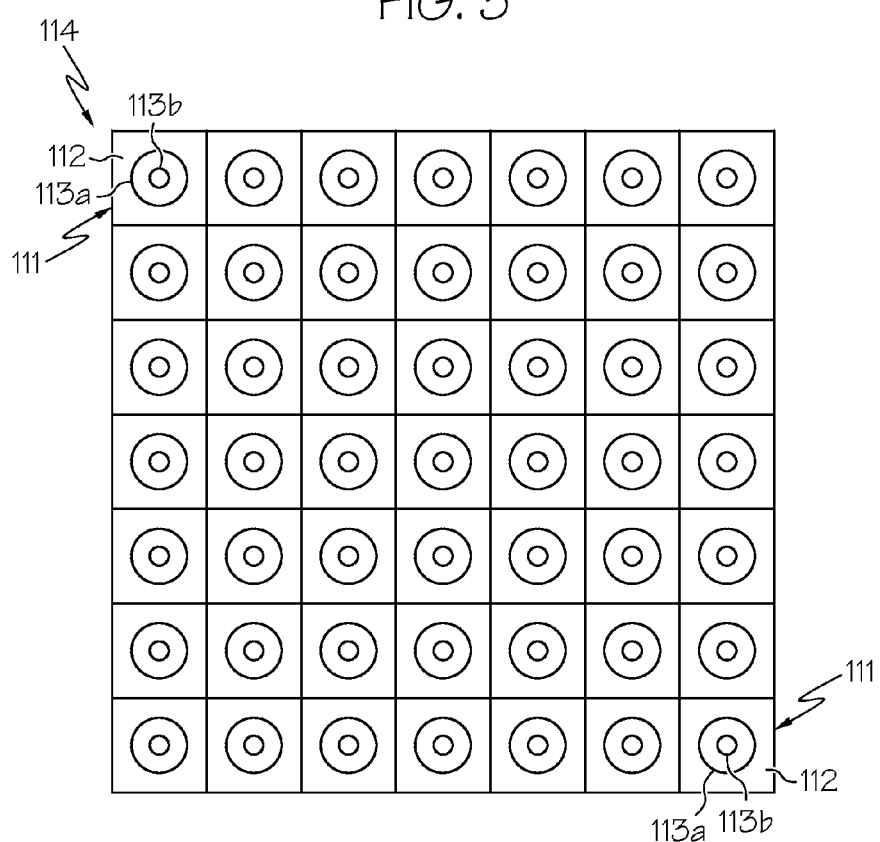
FIG. 4A depicts a top view of a jet plate of a cooling apparatus according to one or more embodiments shown and described herein.
Figure 4B:
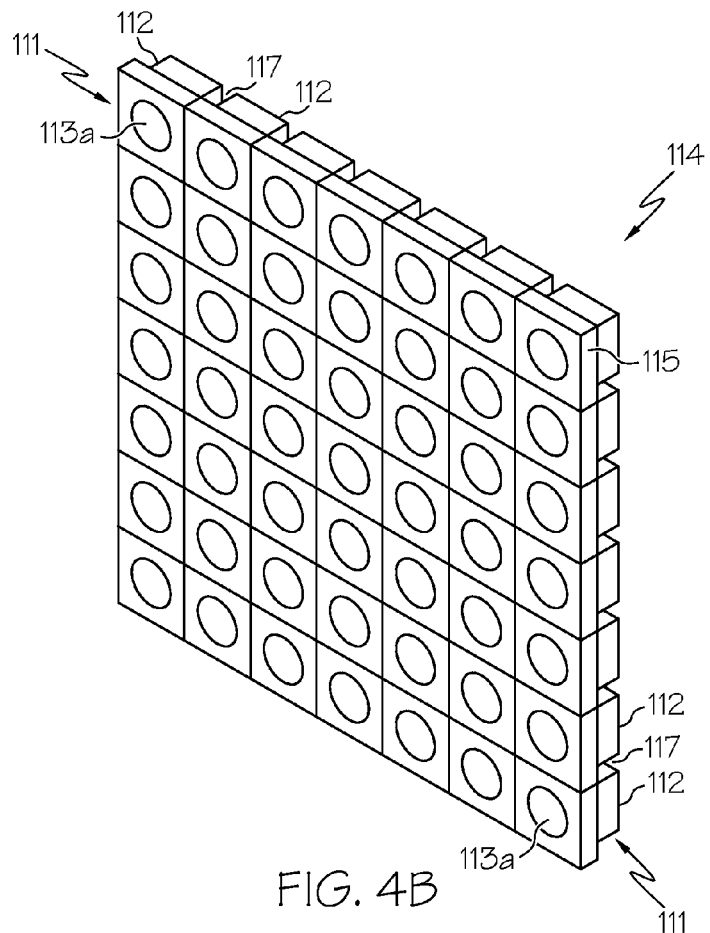
FIG. 4B depicts a top perspective view of the jet plate illustrated in FIG. 4A.
Figure 4C:
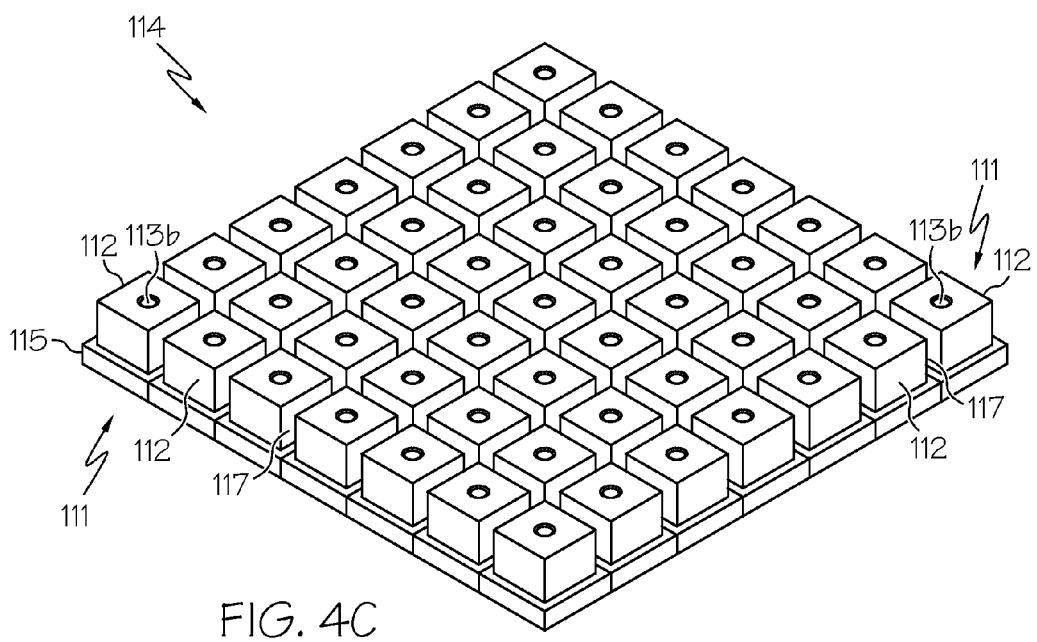
FIG. 4C depicts a bottom perspective view of the jet plate illustrated in FIG. 4A.

Coupled to the target plate 118 is a jet plate 114 that is configured to provide the jets of coolant fluid that impinge the target plate 118 at the impingement locations 131. FIG. 1C illustrates a cross section view of a jet plate 114, FIG. 2 illustrates a partial top perspective view of a jet plate 114 coupled to a target plate 118, while FIGS. 4A-4C illustrate various views of a jet plate 114. Referring to FIGS. 1A-2 and 4A-4C, the jet plate 114 may comprise an array of impingement jets 111 that further comprise a jet body 112 and an impingement jet channel 113 disposed within the jet body 112. The array of impingement jets 111 may be supported by a support plate 115 that is opposite from an exit port of the impingement jet channels 113.

The jet bodies 112 may be rectangular in shape and spaced apart to form a grid of fluid collection passageways 117 therebetween. The fluid collection passageways 117 are described in more detail below. The jet bodies 112 are spaced and arranged such that the impingement jet channels 113 are aligned with the impingement locations 131 of the target plate 118. Referring to FIGS. 1C and 2, the impingement jet channel 113 located within each jet body 112 may have a substantially frusto-conical inlet section 113a and a substantially cylindrical outlet section 113b. The coolant fluid may be introduced into the impingement jet channels 113 via a fluid inlet 127 as illustrated in FIG. 1A, a manifold assembly and/or any other coolant fluid introduction system/assembly. The coolant fluid is then forcefully directed through the impingement jets toward the impingement locations 131.

The jet plate 114 may be coupled to the target plate 118 using a variety of methods. In one embodiment, the jet plate 114 and target plate 118 may be tightly held together by a clamping device such that the bottom surface of the jet bodies 112 contact the wedge-shaped features 120 of the target plate 118 (see FIG. 2). In another embodiment, the two plates may be coupled together by an adhesive, or by soldering or brazing. The jet bodies 112 should contact the wedge shaped features 120 such that the coolant fluid is directed through the wavy-fin microchannels 122 located between the features 120.

The jet plate 114 may also be made of a thermally conductive material that allows for the transfer of thermal energy from the power electronics device 140 to the jet plate 114 and coolant fluid. As described above with respect to the target plate 118, exemplary materials include, but are not limited to, copper, aluminum, thermally enhanced composite materials, and polymer composite materials. The jet plate 114, including the support plate 115, jet bodies 112 and impingement jet channels 113 may be formed by a molding/casting process, a machining process or similar process to achieve the desired features, shapes and configuration.

As stated above, the jet bodies 112 of the array of impingement jets are spaced apart such that a gap exists between each individual jet body 112. Referring to FIGS. 2 and 4C, these gaps define a plurality of fluid collection passageways 117 that are arranged in a grid pattern. The fluid collection passageways 117 are mini-scale channels that collect the coolant fluid exiting the wavy-fin microchannels 122 of the target plate 118. Generally, the width of the fluid collection passageways 117 is greater than the average width of the wavy-fin microchannels 122. Therefore, the coolant fluid may quickly and efficiently flow into the fluid collection passageways 117 from the wavy-fin microchannels 122.

The jet plate 114 and target plate 118 may be enclosed within a housing 125 as illustrated in FIG. 1A and described above. For example, in one embodiment, the housing 125 may be configured as a thermally conductive overmold.

In one embodiment, an additional cooling apparatus may also be coupled to the power electronics device by the coupling methods described above such that power electronics module comprises a double-sided cooling structure. A first cooling apparatus may be coupled to a first side of the power electronics device (e.g., a top surface) and an additional cooling apparatus may be coupled to a second side of the power electronics device (e.g., a bottom surface).

Referring specifically to FIGS. 1C and 2, as well as generally to the remaining figures, operation of one embodiment of a power electronics module 100 and associated cooling apparatus 110 will now be described. Heat flux, indicated by arrows 150 in FIG. 1C, is generated by the power electronics device 140 and is transferred to the target plate 118 through the substrate layer 104. To reduce the operating temperature of the power electronics device 140, coolant fluid is introduced into each impingement jet 111 through the impingement jet channels 113 as illustrated by arrow 130 of FIG. 1C. It is noted that coolant flow is only depicted through one impingement jet channel 113 for ease of illustration. During operation, coolant fluid may flow through all or some of the impingement jet channels 113 of the impingement jets 111.

The coolant fluid 130 flows through the impingement jet channels 113 and impinges the target plate 118 at the impingement locations 131 positioned within the center of each microchannel cell 119. Thermal energy is transferred to the coolant fluid as it impinges the target plate 118. After impinging the target plate 118, the coolant fluid flows radially in all directions through the wavy-fin microchannels 122 and past the wedge-shaped features 120 of the microchannel cells 119. The geometrically optimized, curved walls provide for an enhanced surface area for thermal transfer to the coolant fluid as it travels through the wavy-fin microchannels 122. The coolant fluid radially flows from the center impingement location 131 to the perimeter of each microchannel cell 119.

Upon reaching the perimeter of the microchannel cell 119, the coolant fluid strikes either an obstruction (e.g., the housing 125 or overmold) or coolant fluid flowing in an opposition direction from an adjacent microchannel cell, thereby forcing the coolant fluid to flow into the fluid collection passageways as indicated by arrows 133 of FIG. 1C. The direction of coolant fluid flow into the fluid collection passageways is normal to the wavy-fin microchannels 122. FIG. 2 provides a perspective view of the arrangement between the wavy-fin microchannels 122 and the fluid collection passageways 117. The area of the microchannel cells 119 may be relatively small such that the amount of time the coolant fluid is in contact with the target plate 118 is limited. The relatively large fluid collection passageways 117 allow the coolant fluid to be efficiently removed from the target plate area. By quickly and efficiently removing the coolant fluid from the target plate 118, cooler coolant fluid may be rapidly impinged onto the target plate 118.

After entering the fluid collection passageways 117, which are all interconnected in a grid pattern, the coolant fluid may flow toward one or more fluid outlets where it is removed from the cooling apparatus 110. For example, the fluid outlet 129 may be configured as a rectangular slot on a first side of the cooling apparatus 110 as illustrated in FIG. 1A. In another embodiment, one or more fluid outlets may be located on each side, or selected sides. The coolant fluid, after exiting the cooling apparatus 110, may be recirculated back to a coolant fluid reservoir, such as a radiator.

It should now be understood that embodiments of the cooling apparatuses and power electronics modules described herein may be utilized to remove heat generated by a heat generating device, such as a semiconductor device, by jet impingement of a coolant fluid and surface area enhancement. Embodiments may have a target plate comprising an array of microchannel cells each having a plurality of wavy-fin microchannels, and an array of impingement jets that form a grid of fluid collection passageways. Heat produced by the heat generating device may be removed by impinging the coolant fluid onto the target plate, efficiently routing of the coolant fluid through the wavy-fin microchannels, and rapidly removing the coolant fluid from the cooling apparatus through the fluid collection passageways. The short distanced traveled through the wavy-fin microchannels and the immediate removal of the coolant fluid through the fluid collection passageways may both increase heat transfer and reduce pressure drop within the cooling apparatus.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling apparatus for a power electronics system comprising:
    a jet plate comprising a support plate and an array of jet bodies extending from a surface of the support plate in a first direction, wherein each jet body of the array of jet bodies comprises an impingement jet channel disposed within the jet body, and each jet body is spaced apart from adjacent jet bodies, thereby forming a plurality of fluid collection passageways arranged in a grid pattern;
    a target plate comprising an array of microchannel cells, each microchannel cell comprising a plurality of wavy-fin microchannels radially extending from an impingement location positioned opposite from an individual impingement jet channel, wherein each impingement location is positioned to receive an impingement jet of coolant fluid introduced into the cooling apparatus; and
    a fluid outlet that is fluidly coupled to the fluid collection passageways, wherein the plurality of fluid collection passageways and the fluid outlet are arranged such that coolant fluid introduced into the cooling apparatus flows through the plurality of fluid collection passageways toward the fluid outlet in a direction that is orthogonal to the first direction.

2. The cooling apparatus of claim 1, wherein the jet plate is configured such that coolant fluid introduced into the cooling apparatus does not pass through the support plate after impinging the target plate.

3. The cooling apparatus of claim 1, wherein individual fluid collection passageways of the plurality of fluid collection passageways are fluidly coupled to one another within the jet plate.

4. The cooling apparatus of claim 1, wherein a width of the fluid collection passageways is greater than an average width of the wavy-fin microchannels.

5. The cooling apparatus of claim 1, wherein the target plate comprises a plurality of features having one or more curved walls, and the wavy-fin microchannels are located between the plurality of features.

6. The cooling apparatus of claim 5, wherein the features of the target plate have a non-uniform size and shape.

7. The cooling apparatus of claim 1, wherein each jet channel comprises a frusto-conical inlet section and a cylindrical outlet section.

8. The cooling apparatus of claim 1, wherein the jet bodies of the array of impingement jets are rectangular.

9. The cooling apparatus of claim 1, wherein the fluid outlet is positioned in a plane that is transverse to the jet plate.

10. The cooling apparatus of claim 1, wherein coolant fluid introduced into the cooling apparatus is directed to a perimeter of the cooling apparatus through the plurality of fluid collection passageways in a direction orthogonal to the first direction.

11. A power electronics module comprising:
    a cooling apparatus comprising:
        a jet plate comprising a support plate and an array of jet bodies extending from a surface of the support plate in a first direction, wherein each jet body of the array of jet bodies comprises an impingement jet channel disposed within the jet body, and each jet body is spaced apart from adjacent jet bodies, thereby forming a plurality of fluid collection passageways arranged in a grid pattern;
        a target plate comprising an array of microchannel cells, each microchannel cell comprising a plurality of wavy-fin microchannels radially extending from an impingement location positioned opposite from an individual impingement jet channel, wherein each impingement location is positioned to receive an impingement jet of coolant fluid introduced into the cooling apparatus; and
        a fluid outlet that is fluidly coupled to the fluid collection passageways, wherein the plurality of fluid collection passageways and the fluid outlet are arranged such that coolant fluid introduced into the cooling apparatus flows through the plurality of fluid collection passageways toward the fluid outlet in a direction that is orthogonal to the first direction; and
        a housing that encloses the jet plate, the target plate and the plurality of fluid collection passageways;
    a substrate layer coupled to the cooling apparatus at the target plate; and
    at least one power electronics device coupled to the substrate layer.

12. The power electronics module of claim 11, wherein the jet plate is configured such that coolant fluid introduced into the cooling apparatus does not pass through the support plate after impinging the target plate.

13. The power electronics module of claim 11, wherein individual fluid collection passageways of the plurality of fluid collection passageways are fluidly coupled to one another within the jet plate.

14. The power electronics module of claim 11, wherein a width of the fluid collection passageways is greater than an average width of the wavy-fin microchannels.

15. The power electronics module of claim 11, wherein the target plate comprises a plurality of features having one or more curved walls, and the wavy-fin microchannels are located between the plurality of features.

16. The power electronics module of claim 15, wherein the features of the target plate have a non-uniform size and shape.

17. The power electronics module of claim 11, wherein coolant fluid introduced into the cooling apparatus is directed to a perimeter of the cooling apparatus through the plurality of fluid collection passageways in a direction orthogonal to the first direction.

18. The power electronics module of claim 11 further comprising an additional cooling apparatus, wherein the cooling apparatus is coupled to a first side of the power electronics device, and the additional cooling apparatus is coupled to a second side of the power electronics device.

19. A cooling apparatus for a power electronics system comprising:
a jet plate comprising a support plate and an array of jet bodies extending from a surface of the support plate in a first direction, wherein each jet body of the array of jet bodies comprises an impingement jet channel disposed within the jet body, and each jet body is spaced apart from adjacent jet bodies, thereby forming a plurality of fluid collection passageways such that individual fluid collection passageways of the plurality of fluid passageways are interconnected;
a target plate comprising an array of microchannel cells, each microchannel cell comprising a plurality of features having one or more curved walls that define a plurality of wavy-fin microchannels radially extending from an impingement location positioned opposite from an individual impingement jet channel such that coolant fluid introduced into the cooling apparatus is directed toward the impingement location through the array of jet bodies and travels through the wavy-fin microchannels in a radial direction; and
a fluid outlet that is fluidly coupled to the fluid collection passageways, wherein the plurality of fluid collection passageways and the fluid outlet are arranged such that coolant fluid introduced into the cooling apparatus exits the wavy-fin microchannels after impinging the impingement locations at the target plate, and flows into the plurality of fluid collection passageways toward the fluid outlet in a direction that is orthogonal to the first direction.

20. The cooling apparatus of claim 19, wherein:
a width of the fluid collection passageways is greater than an average width of the wavy-fin microchannels; and
the features of the target plate have a non-uniform size and shape.

* * * * *